United States Patent
Pan et al.

(10) Patent No.: US 8,467,153 B1
(45) Date of Patent: Jun. 18, 2013

(54) DISK DRIVE HEAD GIMBAL ASSEMBLY HAVING A FLEXURE TAIL WITH FOLDED BOND PADS

(75) Inventors: Tzong-Shii Pan, San Jose, CA (US); Fernando A. Magsombol, Muntinlupa (PH)

(73) Assignee: Western Digital Technologies, Inc., Irvine, CA (US)

( * ) Notice: Subject to any disclaimer, the term of this patent is extended or adjusted under 35 U.S.C. 154(b) by 79 days.

(21) Appl. No.: 12/916,237

(22) Filed: Oct. 29, 2010

(51) Int. Cl.
*G11B 5/55* (2006.01)
*G11B 21/08* (2006.01)

(52) U.S. Cl.
USPC .................................. 360/264.2; 360/245.9

(58) Field of Classification Search
USPC ......................................... 360/264.2, 266.3
See application file for complete search history.

(56) References Cited

U.S. PATENT DOCUMENTS

| | | | |
|---|---|---|---|
| 5,465,186 A | 11/1995 | Bajorek et al. | |
| 5,861,661 A | 1/1999 | Tang et al. | |
| 5,903,056 A | 5/1999 | Canning et al. | |
| 6,036,813 A | 3/2000 | Schulz et al. | |
| 6,228,689 B1 | 5/2001 | Liu | |
| 6,351,352 B1 | 2/2002 | Khan et al. | |
| 6,381,099 B1 | 4/2002 | Mei | |
| 6,382,499 B1 | 5/2002 | Satoh et al. | |
| 6,614,623 B2 | 9/2003 | Nakamura et al. | |
| 6,639,757 B2 | 10/2003 | Morley et al. | |
| 6,656,772 B2 | 12/2003 | Huang | |
| 6,703,566 B1 | 3/2004 | Shiraishi et al. | |
| 6,757,137 B1 | 6/2004 | Mei | |
| 6,992,862 B2 | 1/2006 | Childers et al. | |
| 7,075,701 B2 | 7/2006 | Novotny et al. | |
| 7,154,708 B2 | 12/2006 | Chhabra et al. | |
| 7,205,484 B2 | 4/2007 | Shiraishi et al. | |
| 7,245,458 B2 | 7/2007 | Zhang et al. | |
| 7,298,593 B2 | 11/2007 | Yao et al. | |
| 7,359,154 B2 | 4/2008 | Yao et al. | |
| 7,372,669 B2 | 5/2008 | Deguchi et al. | |
| 7,375,874 B1 | 5/2008 | Novotny et al. | |
| 7,388,733 B2 | 6/2008 | Swanson et al. | |
| 7,394,139 B2 | 7/2008 | Park et al. | |
| 7,414,814 B1 | 8/2008 | Pan | |
| 7,440,236 B1 | 10/2008 | Bennin et al. | |
| 7,450,346 B2 | 11/2008 | Arya et al. | |
| 7,515,240 B2 | 4/2009 | Lu et al. | |
| 7,525,769 B2 | 4/2009 | Yao et al. | |
| 7,652,890 B2 | 1/2010 | Ohsawa et al. | |
| 7,697,102 B2 | 4/2010 | Hirakata et al. | |
| 7,764,467 B2 | 7/2010 | Hanya et al. | |

(Continued)

OTHER PUBLICATIONS

Notice of Allowance dated Apr. 11, 2012 from U.S. Appl. No. 13/078,829, 22 pages.

(Continued)

*Primary Examiner* — Craig A. Renner
*Assistant Examiner* — Gustavo Polo (57) ABSTRACT

A head gimbal assembly for a disk drive includes a read head and a suspension assembly. The suspension assembly includes a load beam and a laminate flexure. The laminate flexure includes a structural layer, a dielectric layer, and a conductive layer. The laminate flexure includes a tongue portion that connects to the read head and a flexure tail that extends away from the tongue portion. The flexure tail includes a plurality of flexure bond pads. Each of the plurality of flexure bond pads is folded upon itself.

11 Claims, 9 Drawing Sheets

U.S. PATENT DOCUMENTS

| | | |
|---|---|---|
| 7,876,664 B2 | 1/2011 | Tsukagoshi et al. |
| 8,015,692 B1 | 9/2011 | Zhang et al. |
| 8,111,483 B2 | 2/2012 | Arai |
| 2001/0017749 A1 | 8/2001 | Stefansky |
| 2005/0030670 A1 | 2/2005 | Ando et al. |
| 2005/0243472 A1 | 11/2005 | Kamigama et al. |
| 2006/0098347 A1 | 5/2006 | Yao et al. |
| 2006/0146262 A1 | 7/2006 | Yu et al. |
| 2006/0157869 A1 | 7/2006 | Huang et al. |
| 2007/0246251 A1 | 10/2007 | Shiraishi et al. |
| 2008/0002303 A1 | 1/2008 | Wang et al. |
| 2008/0068757 A1 | 3/2008 | Kamigama et al. |
| 2008/0088975 A1 | 4/2008 | Bennin et al. |
| 2008/0225439 A1* | 9/2008 | Komura .................... 360/264.2 |
| 2009/0151994 A1 | 6/2009 | Ohsawa et al. |
| 2009/0211789 A1 | 8/2009 | Yeates et al. |
| 2009/0253233 A1 | 10/2009 | Chang et al. |
| 2010/0118444 A1 | 5/2010 | Rothenberg et al. |
| 2010/0176827 A1 | 7/2010 | Yamazaki et al. |
| 2010/0188778 A1 | 7/2010 | Castagna |
| 2010/0195474 A1 | 8/2010 | Tsukuda et al. |
| 2011/0317309 A1 | 12/2011 | Shum et al. |
| 2012/0067626 A1 | 3/2012 | Mizutani |

OTHER PUBLICATIONS

Notice of Allowance dated May 21, 2012 from U.S. Appl. No. 13/164,936, 17 pages.

Notice of Allowance dated May 21, 2012 from U.S. Appl. No. 13/398,578, 16 pages.

Notice of Allowance dated May 29, 2012 from U.S. Appl. No. 13/164,959, 17 pages.

US 7,337,529, 03/2008, Bennin et al. (withdrawn)

* cited by examiner

DISK DRIVE HEAD GIMBAL ASSEMBLY HAVING A FLEXURE TAIL WITH FOLDED BOND PADS

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head-gimbal assembly (HGA) that typically includes a laminated flexure to carry the electrical signals to and from the head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include conductive copper traces that are isolated from a stainless steel structural layer by a polyimide dielectric layer. So that the signals from/to the head can reach the FPC on the actuator body, each HGA flexure includes a flexure tail that extends away from the head along a corresponding actuator arm and ultimately attaches to the FPC adjacent the actuator body. That is, the flexure includes traces that extend from adjacent the head and continue along the flexure tail to electrical connection points. The FPC includes conductive electrical terminals that correspond to the electrical connection points of the flexure tail.

To facilitate electrical connection of the conductive traces of the flexure tails to the conductive electrical terminals of the FPC during the HSA manufacturing process, the flexure tails must first be properly positioned relative to the FPC so that the conductive traces of the flexure tails are aligned with the conductive electrical terminals of the FPC. Then the flexure tails must be held or constrained against the conductive electrical terminals of the FPC while the aforementioned electrical connections are made (e.g. by ultrasonic bonding, solder jet bonding, or solder bump reflow).

However, recently for some disk drive products, the aforementioned electrical connections may employ a type of anisotropic conductive film (ACF) bonding. An anisotropic conductive film is typically an adhesive doped with conductive beads or cylindrical particles of uniform or similar diameter. As the doped adhesive is compressed and cured, it is squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

Maintaining sufficient uniform pressure during adhesive curing, such that a single layer of conductive beads in an ACF makes contact with both opposing surfaces to be bonded, may be achievable for existing HGA designs using a tool that presses only upon a single bond pad. However, in a high-volume manufacturing environment like that necessitated by the very competitive information storage device industry, there is a practical requirement for fast, cost-effective, and robust bonding of many bond pads simultaneously; bonding one bond pad at a time simply takes too much time.

Accordingly, there is a need in the art for an improved HGA design that may facilitate the application of more uniform pressure to groups of bond pads, to more quickly accomplish reliable electrical connection of the conductive traces of a flexure tail to the conductive electrical terminals of a FPC (e.g. by ACF or by any other bonding method that benefits from a more uniform bonding pressure) during HSA manufacture.

DESCRIPTION OF THE PREFERRED EMBODIMENTS

Figure 1:
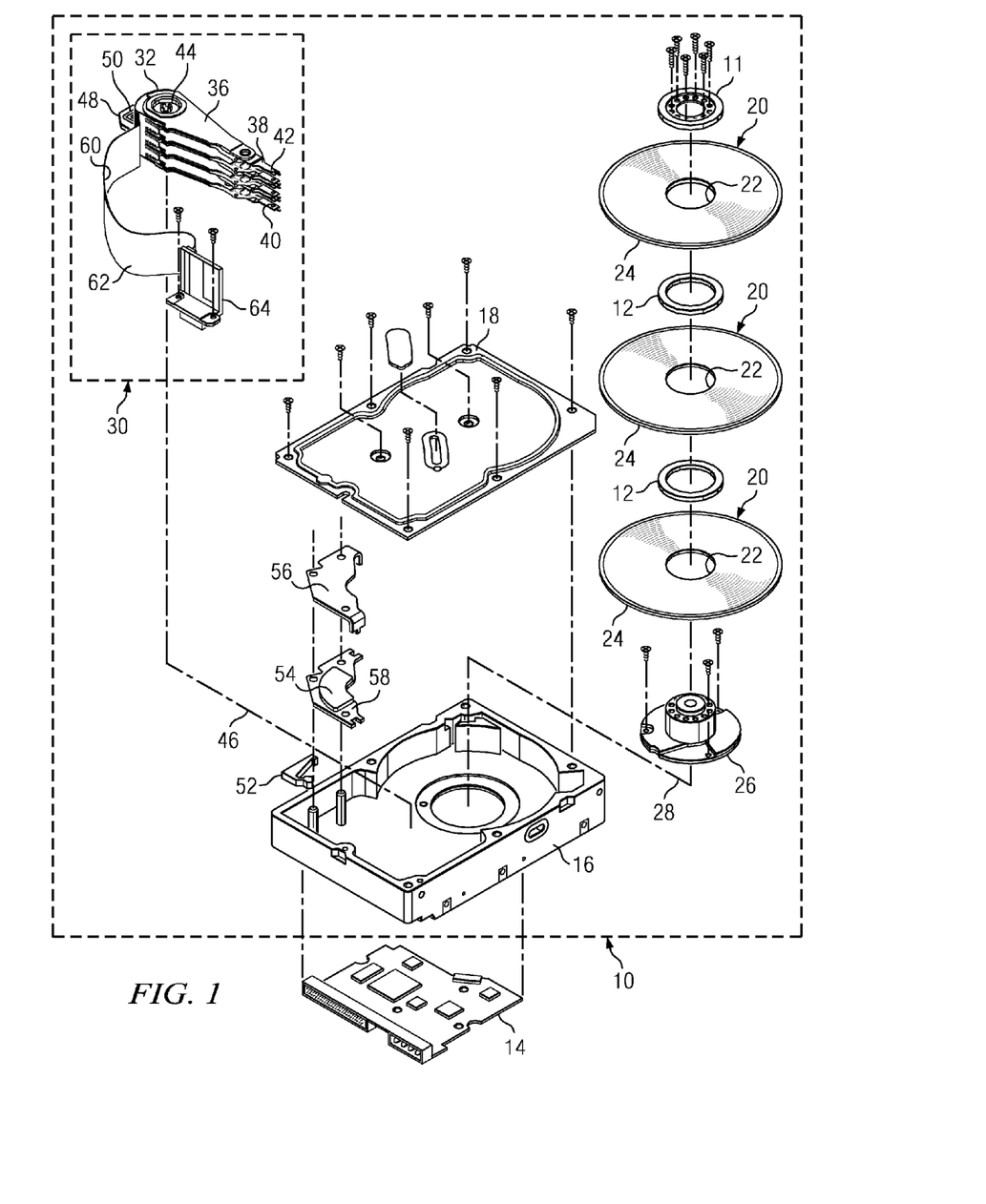
FIG. 1 is an exploded perspective view of a disk drive according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a changing electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40, and a surface of the magnetic disk 20. The thickness of the air bearing at the location of the transducer is commonly referred to as "flying height."

Figure 2:
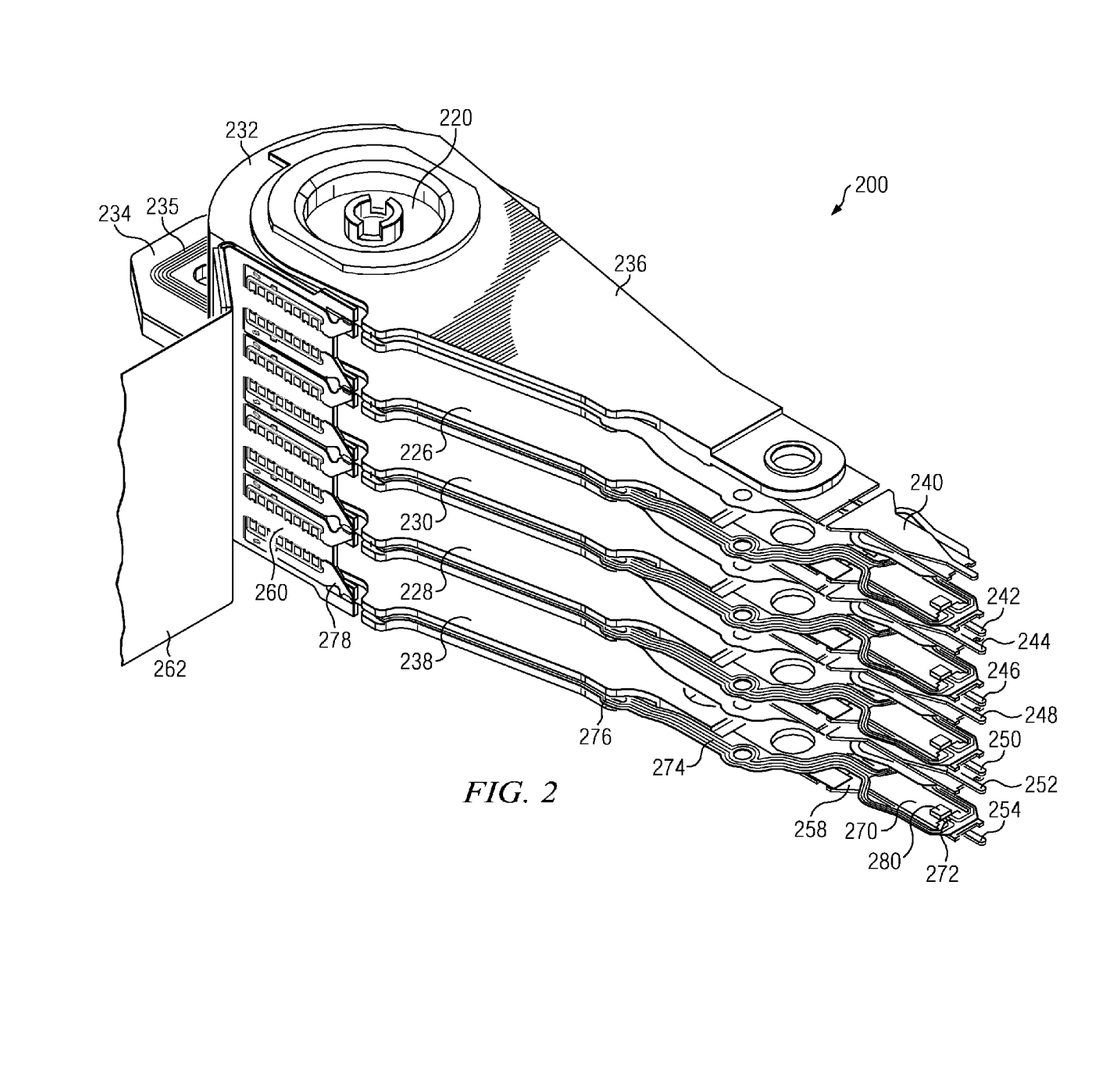
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 228, 230, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 228, 230, 236, 238. The HSA 200 also includes a plurality of head gimbal assemblies (HGA) 240, 242, 244, 246, 248, 250, 252, 254, attached to the actuator arms 226, 228, 230, 236, 238. For example, such attachment may be made by swaging. Note that each of the inner actuator arms 226, 228, 230 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 (another part of the HGA 254). The laminated flexure 270 may include a structural layer (e.g. stainless steel), a dielectric layer (e.g. polymide), and a conductive layer into which traces are patterned (e.g. copper). The HSA 200 also includes a flexible printed circuit (FPC) 260 adjacent the actuator body 232, and the FPC 260 includes a flex cable 262. The FPC 260 may comprise a laminate that includes two or more conventional dielectric and conductive layer materials (e.g. one or more polymeric materials, copper, etc). The laminated flexure 270 includes a flexure tail 274 that includes an intermediate region 276 that is disposed adjacent the actuator arm 238, and a terminal region 278 that is electrically connected to bond pads of the FPC 260.

Methods of electrical connection of the flexure tails to the FPC 260 include solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining sufficient uniform pressure to groups of bond pads may be desirable during this process, and may be facilitated by certain inventive structural features in the terminal regions of the flexure tails.

Figure 3A:
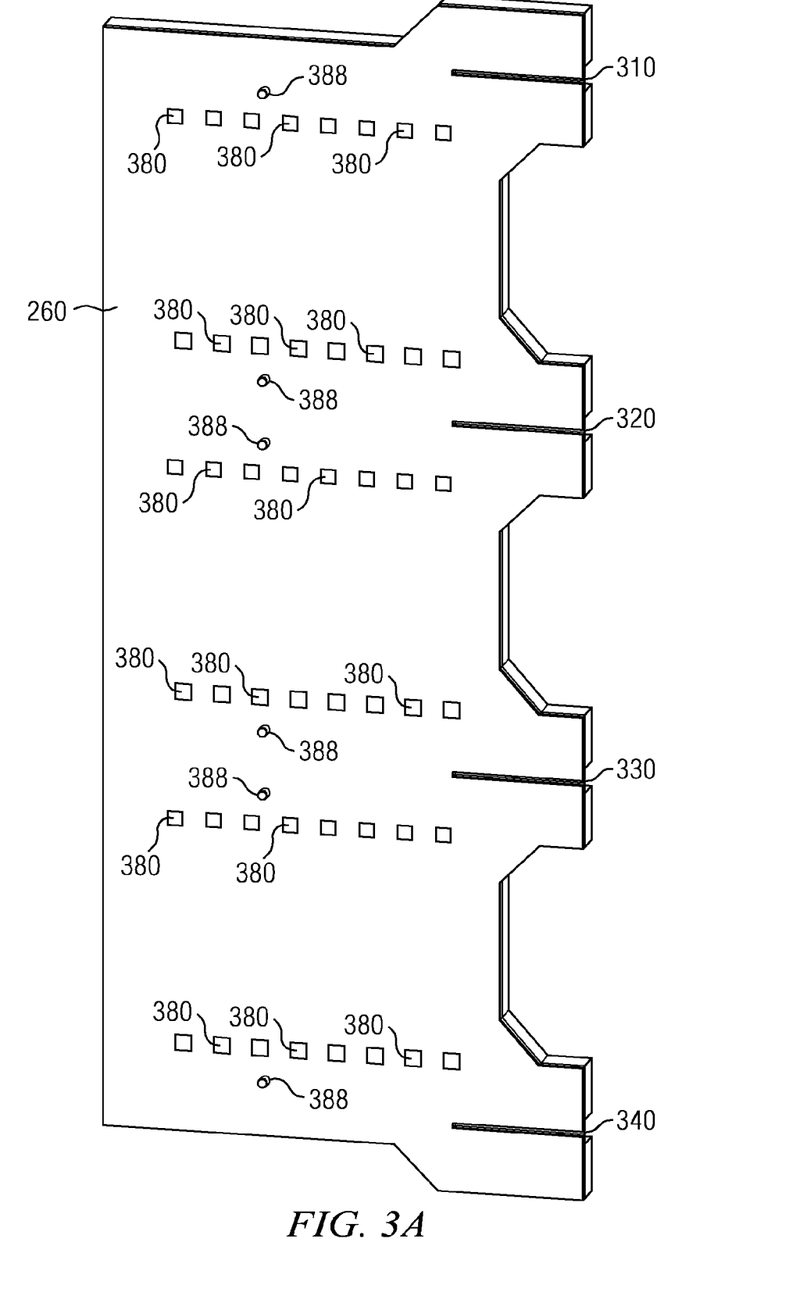
FIG. 3A is a perspective view of a portion of a flexible printed circuit (FPC) according to an embodiment of the present invention.
Figure 3B:
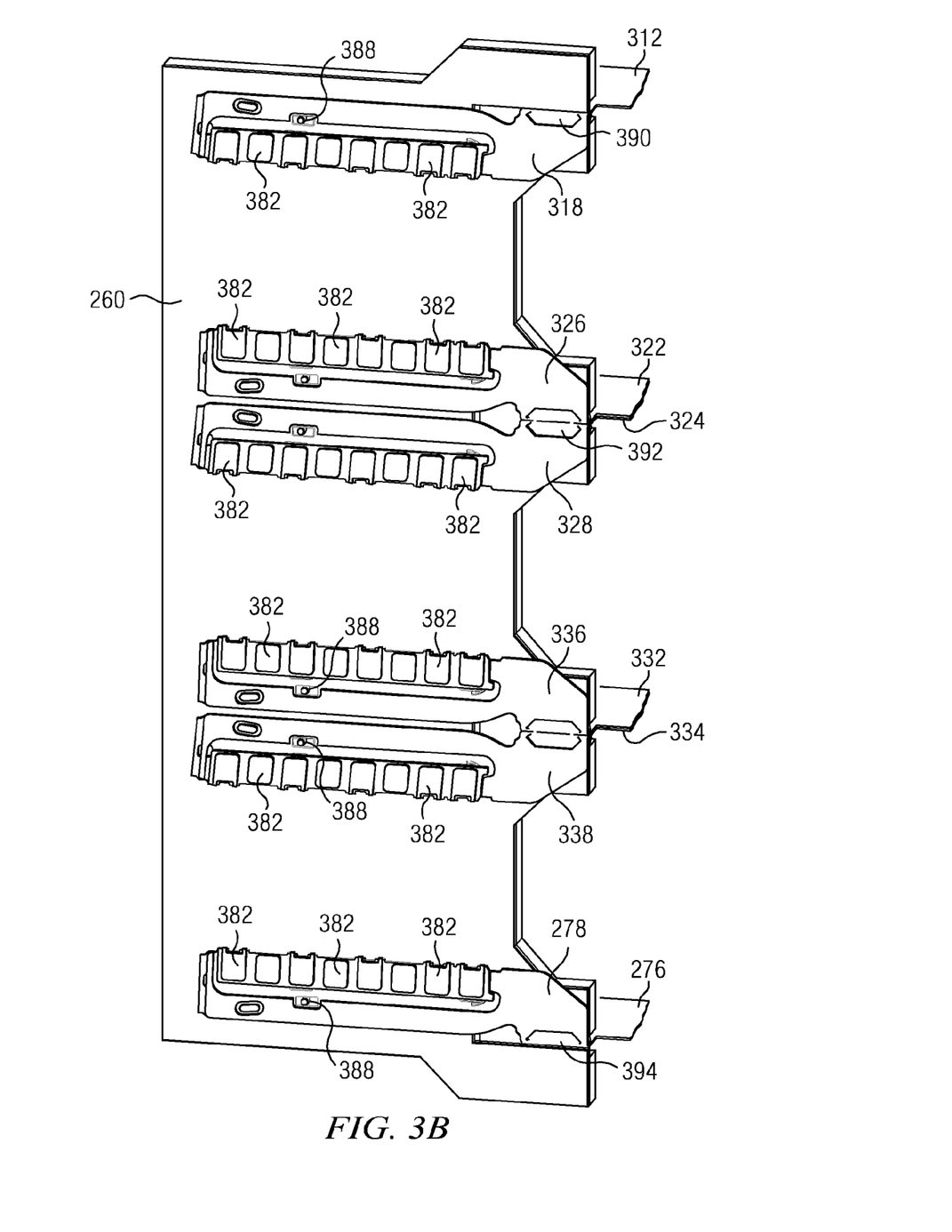
FIG. 3B is a perspective view of a plurality of flexure tail terminal regions attached to the FPC portion of FIG. 3A, according to an embodiment of the present invention.

For example, FIG. 3B is a perspective view of a plurality of flexure tail terminal regions 278, 318, 326, 328, 336, 338 that are electrically connected to the FPC 260, according to an embodiment of the present invention. FIG. 3A depicts the FPC 260 before the flexure tail terminal regions 278, 318, 326, 328, 336, 338 are bonded thereto. Now referring to FIGS. 3A and 3B, the FPC 260 includes electrical conduits that terminate at FPC bond pads 380 which are aligned with and connected to flexure bond pads 382 of the terminal regions 278, 318, 326, 328, 336, 338 of the HGA flexure tails.

As shown in FIG. 3B, each of the flexure tail terminal regions 278, 318, 326, 328, 336, 338 optionally includes an alignment hole to accommodate the alignment posts 388. Moreover, each of the flexure tail intermediate regions 276, 312, 322, 324, 332, 334 may extend into one of the slits 310, 320, 330, 340. Note that in the example embodiment of FIGS. 3A-B, each of the flexure tails is bent near a corresponding slit so that each of the flexure tail terminal regions 278, 318, 326, 328, 336, 338 is substantially orthogonal to the intermediate region 276, 312, 322, 324, 332, 334 of the same flexure tail. In the embodiment of FIG. 3B, such bending may be facilitated by an optional hexagonal opening (e.g. hexagonal opening 390, 392, or 394) extending through each of the flexure tails that is depicted.

Figure 4A:
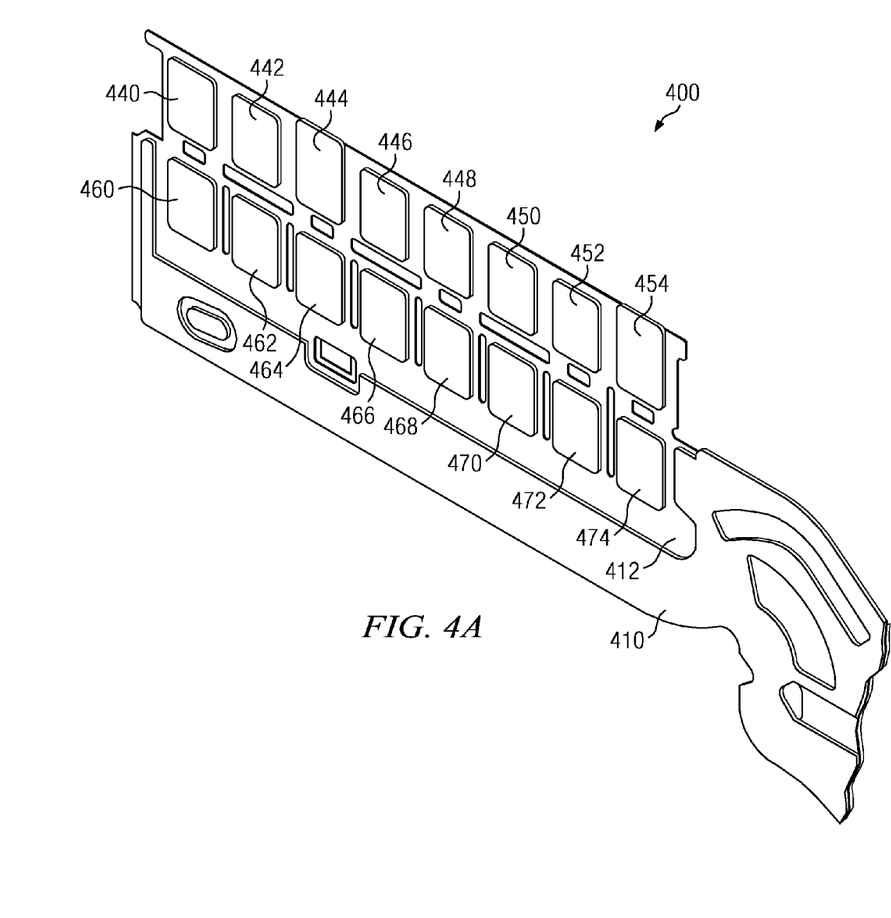
FIG. 4A depicts a flexure tail terminal region before folding, according to an embodiment of the present invention.
Figure 4B:
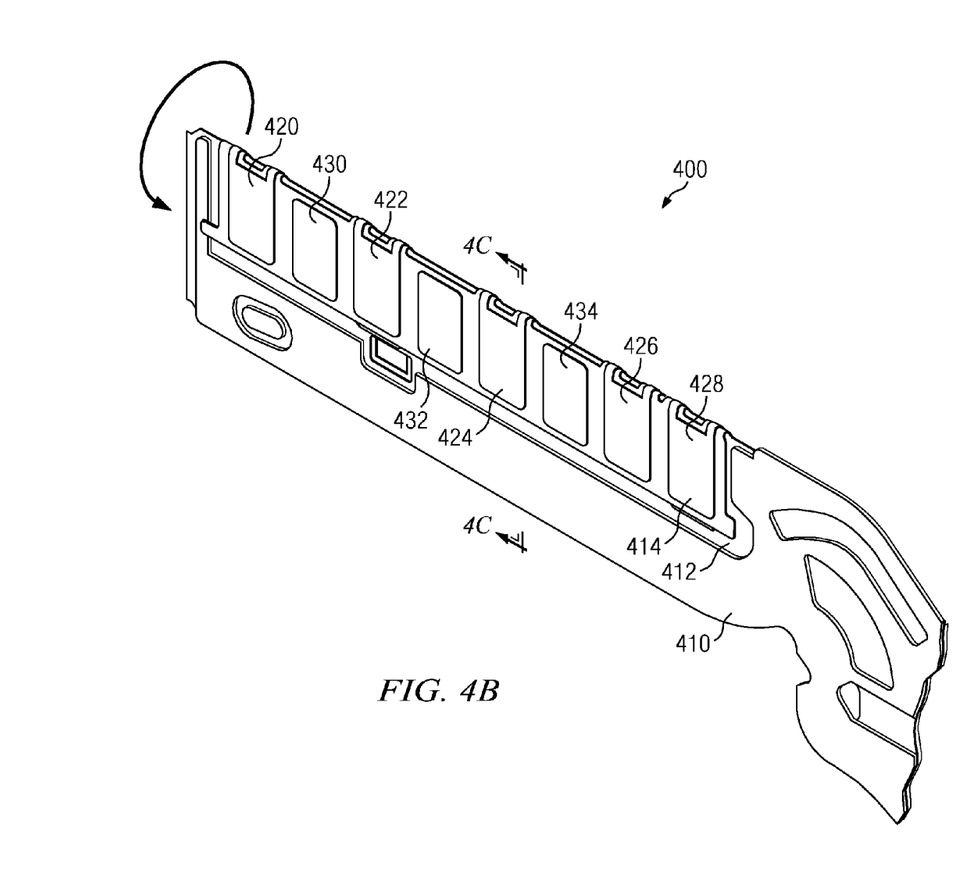
FIG. 4B depicts a flexure tail terminal region after folding, according to an embodiment of the present invention.
Figure 4C:
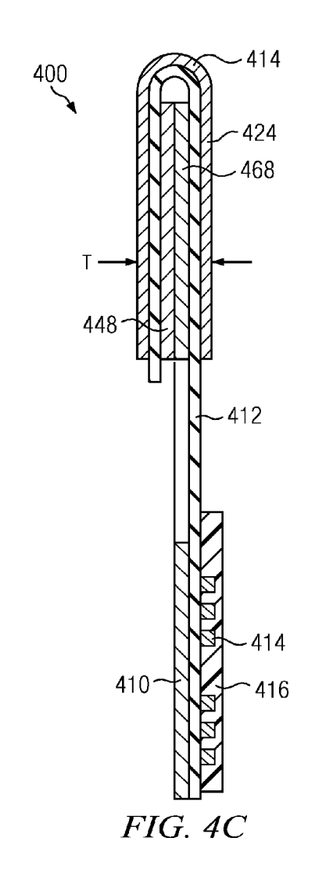
FIG. 4C depicts a cross-section of the folded flexure tail terminal region of FIG. 4B.

FIG. 4A depicts a close up perspective view of a flexure tail terminal region 400 of a laminate flexure, before its bond pads are folded upon themselves according to an example embodiment of the present invention. FIG. 4B shows the flexure tail terminal region 400 after its bond pads are folded upon themselves, and FIG. 4C depicts a cross section of FIG. 4B. Now referring additionally to FIGS. 4A-C, the flexure tail terminal region 400 of the laminate flexure comprises a structural layer 410, a dielectric layer 412, and a conductive layer 414. In certain embodiments, the structural layer 410 comprises stainless steel, the dielectric layer 412 comprises polyimide, and the conductive layer 414 comprises copper, for example, though it is contemplated that other materials providing similar function might be used instead. Certain embodiments optionally further comprise an insulative cover layer 416 (e.g. a polymeric material), that covers and insulates portions of the conductive layer 414.

The flexure tail terminal region 400 includes a plurality of flexure bond pads 420, 422, 424, 426, 428, each of which aligned with a corresponding one of the plurality of FPC bond pads 380. The flexure tail terminal region 400 also includes flexure bond pads 430, 432, 434, which are also aligned with corresponding ones of the plurality of FPC bond pads 380. Each of the plurality of flexure bond pads 420, 422, 424, 426, 428, 430, 432, and 434 is folded upon itself. In certain embodiments, folding each of the plurality of flexure bond pads 420, 422, 424, 426, 428, 430, 432, and 434 upon itself comprises simultaneously folding all of the plurality of flexure bond pads 420, 422, 424, 426, 428, 430, 432, and 434 by folding the terminal region 400 of the flexure tail upon itself. In an alternative embodiment, one or more individual bond pads may be folded non-simultaneously with others. In certain embodiments of the present invention, the folding of the flexure tail terminal region 400 at the bond pad locations may precede alignment with the FPC bond pads 380, whereas in other embodiments alignment with FPC bond pads 380 may precede folding.

Before folding, the flexure bond pads 420, 422, 424, 426, 428, 430, 432, and 434 are not visible in FIG. 4A because they are disposed on the side of the flexure tail terminal region 400 that is facing away from the viewer. After folding, portions of the flexure bond pads 420, 422, 424, 426, 428, 430, 432, and 434 are visible in FIG. 4B. In the case of flexure bond pads 420, 422, 424, 426, 428, the portions depicted in FIG. 4B are shown to be electrically continuous with corresponding portions (on the side of the flexure tail terminal region 400 that is facing away from the viewer) that would be electrically connected to the FPC bond pads 380. In the case of flexure bond pads 430, 432, and 434, however, the portions depicted in FIG. 4B are shown to be electrically discontinuous with portions (on the side of the flexure tail terminal region 400 that is facing away from the viewer) that would be electrically connected to the FPC bond pads 380.

In the embodiment of FIGS. 4A-C, a plurality of backing plates 440, 442, 444, 446, 448, 450, 452, 454, 460, 462, 464, 466, 468, 470, 472, and 474 are defined in the structural layer 410 and are disposed in general alignment with corresponding flexure bonding pads. For example, a pair of backing plates 440, 460 are disposed in general alignment with bond pad 420. Likewise, a pair of backing plates 442, 462 are disposed in general alignment with bond pad 430. As shown best in FIG. 4C, upon folding, the two backing plates (e.g. 448, 468) of each backing plate pair may be brought into facing contact with each other to increase the thickness of the folded flexure tail terminal region 400 at the locations of the bond pads (e.g. at the location of the flexure bond pad 424).

For example, as shown in FIG. 4C, the laminate flexure may define a total folded thickness T at each of the plurality of flexure bond pads that is at twice a thickness of the structural layer, plus twice a thickness of the dielectric layer, plus twice a thickness of the conductive layer (or more, e.g. if surface irregularities, contaminates, and/or additional layers are present). For example, the thickness of the structural layer may be less than 20 microns, the thickness of the dielectric layer may be less than 15 microns, the thickness of the conductive layer may be less than 15 microns, and yet the total folded thickness T may be at least 60 microns.

Figure 5A:
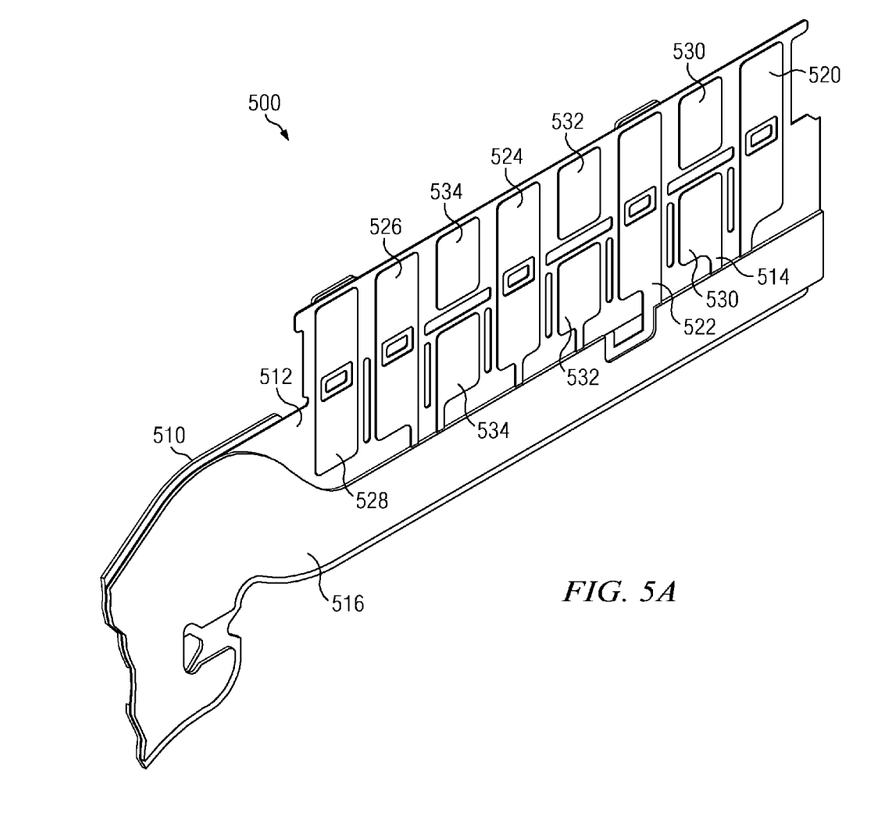
FIG. 5A depicts a flexure tail terminal region before folding, according to an embodiment of the present invention.
Figure 5B:
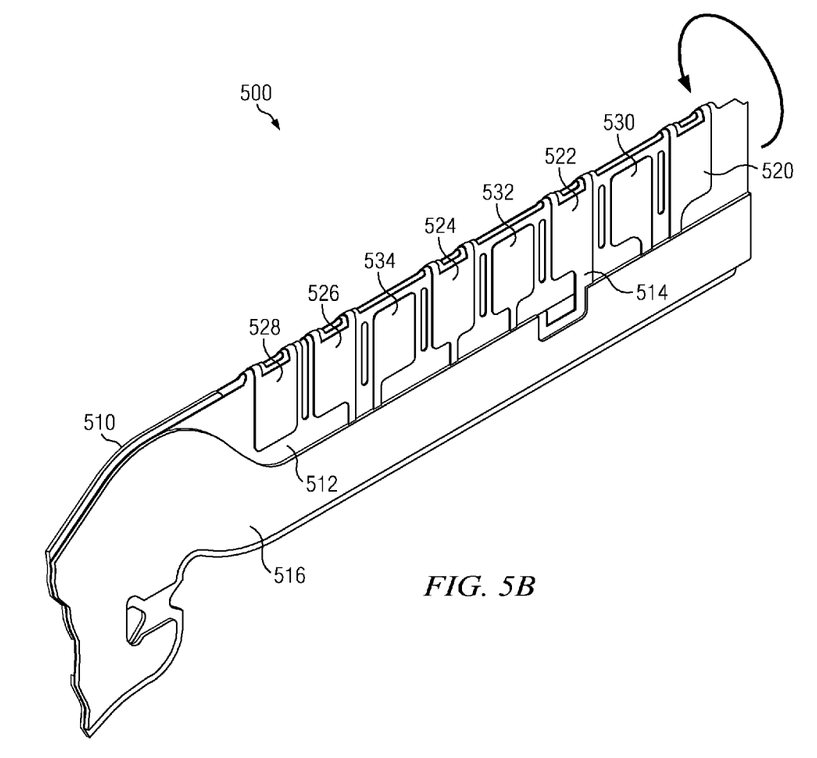
FIG. 5B depicts a flexure tail terminal region after folding, according to an embodiment of the present invention.

FIG. 5A depicts a close up perspective view of a flexure tail terminal region 500 of a laminate flexure, before its bond pads are folded upon themselves according to an example embodiment of the present invention. FIG. 5B shows the flexure tail terminal region 500 after its bond pads are folded upon themselves. Now referring additionally to FIGS. 5A-B, the flexure tail terminal region 500 of the laminate flexure comprises a structural layer 510, a dielectric layer 512, and a conductive layer 514. In certain embodiments, the structural layer 510 comprises stainless steel, the dielectric layer 512 comprises polyimide, and the conductive layer 514 comprises copper, for example, though it is contemplated that other materials providing similar function might be used instead. Certain embodiments optionally further comprise an insulative cover layer 516 (e.g. a polymeric material), that covers and insulates portions of the conductive layer 514.

The flexure tail terminal region 500 includes a plurality of flexure bond pads 520, 522, 524, 526, 528, each of which aligned with a corresponding one of the plurality of FPC bond pads 380. The flexure tail terminal region 500 also includes flexure bond pads 530, 532, 534, which are also aligned with corresponding ones of the plurality of FPC bond pads 380. Each of the plurality of flexure bond pads 520, 522, 524, 526, 528, 530, 532, and 534 is folded upon itself.

Before folding, flexure bond pads 520, 522, 524, 526, 528, 530, 532, and 534 are fully visible in FIG. 5A. That is, in FIG. 5A, both the upper portions and lower portions of the flexure bond pads 520, 522, 524, 526, 528, 530, 532, and 534 are visible. After folding, the upper portions of the flexure bond pads 520, 522, 524, 526, 528, 530, 532, and 534 are not visible in FIG. 4B because such portions are disposed on the side of the flexure tail terminal region 500 that is facing away from the viewer. In certain embodiments, one or more of such upper portions may be covered by the insulative cover layer 516.

In the case of flexure bond pads 520, 522, 524, 526, 528, the lower portions depicted in FIG. 5B, that would be electrically connected to the FPC bond pads 380, are shown to be electrically continuous with corresponding upper portions on the side of the flexure tail terminal region 500 that is facing away from the viewer. In certain cases, this may be done to facilitate contact with probes for electrical test. In the case of flexure bond pads 530, 532, and 534, however, the lower portions depicted in FIG. 5B, that would be electrically connected to the FPC bond pads 380, are shown to be electrically discontinuous with corresponding upper portions on the side of the flexure tail terminal region 500 that is facing away from the viewer.

Figure 6A:
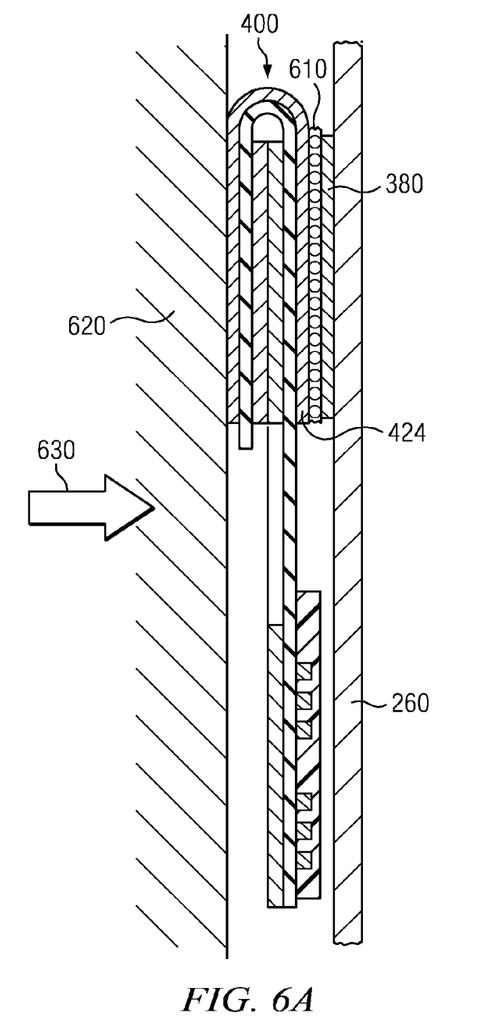
FIG. 6A depicts the bonding of a flexure bond pad to a corresponding flexible printed circuit bond pad by an anisotropic conductive film, according to an embodiment of the present invention.
Figure 6B:
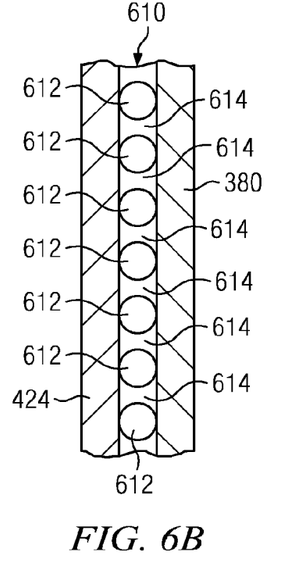
FIG. 6B is an expanded view of a portion of FIG. 6A.

In certain embodiments, each of the flexure bond pads (e.g. flexure bond pad 424 in the embodiment of FIGS. 4A-C) may be bonded to a corresponding one of the plurality of FPC bond pads 380 by an anisotropic conductive film (ACF). For example, FIGS. 6A-B depict the bonding of a flexure bond pad 424 to a corresponding FPC bond pad 380 by an ACF 610. A thermode tool 620 is brought into contact with the plurality of flexure bond pads after folding, with the thermode tool 620 pressing the plurality of flexure bond pads (e.g. including flexure bond pad 424) against the plurality of FPC bond pads (e.g. including the corresponding FPC bond pad 380) for a period. In this context, one of ordinary skill would understand that the phrase "after folding" does not necessarily mean immediately after folding; rather, there could be intermediate steps.

The ACF 610 may comprise an adhesive material 614 that includes a plurality of electrically conductive beads 612 of substantially similar diameter. In certain embodiments the ACF 610 may employ beads of non-spherical shape, such as cylindrical beads. In certain embodiments the adhesive material 614 may be deposited on to FPC bond pad 380 prior to aligning the flexure bond pad 424 thereto. Alternatively, the adhesive material 614 may be deposited on to a first side of the flexure bond pad 424 (facing the FPC bond pad 380), after folding and prior to bringing the thermode tool 620 into contact with an opposing second side of the flexure bond pad 424 (facing the thermode tool 620).

As shown in FIGS. 6A-B, the force 630 that presses (via the thermode tool 620) the flexure bond pad 424 against FPC bond pad 380 during the period of bonding, may arrange the plurality of electrically conductive beads 612 in a monolayer with each of the plurality of electrically conductive beads 612 in electrical contact with the flexure bond pad 424 and the corresponding FPC bond pad 380. The thermode tool 620 may also transfer heat through flexure bond pad 424 during the period of bonding, and raise the temperature of the adhesive material 614 during such period, for example to accelerate curing of the adhesive material 614.

In certain embodiments, the force 630 of the thermode tool 620 is sufficient to cause the electrically conductive beads 612 to be substantially elastically deformed in compression between the flexure bond pad 424 and the corresponding FPC bond pad 380 during the period of thermal curing of the adhesive material 614. After the thermode tool 620 is removed, the electrically conductive beads 612 cool (with the cured adhesive) from an elevated curing temperature. Such cooling causes the electrically conductive beads 612 to shrink relative to their expanded size during thermal curing of the adhesive material 614.

However, the force 630 is preferably chosen to be great enough that the post-curing shrinkage of the electrically conductive beads 612 cannot completely relieve the compressive deformation of the electrically conductive beads 612 that was experienced during curing. Hence, after curing of the adhesive material 614, and after removal of the thermode tool 620, the electrically conductive beads 612 may remain in compression (and somewhat compressively deformed) between the flexure bond pad 424 and the corresponding FPC bond pad 380.

Although residual compression of the electrically conductive beads 612 may correspond to some residual tension in the cured adhesive material 614, the such residual compression of the electrically conductive beads 612 may be desirable to enhance and ensure reliable electrical conductivity of the ACF 610. For example, in the case where the electrically conductive beads 612 are spherical, the residual compression may cause small flat spots where the electrically conductive beads 612 contact the flexure bond pad 424 and the corresponding FPC bond pad 380. Such flat spots can provide a finite contact areas rather than point contacts, which may desirably reduce the electrical resistance of the ACF 610.

To help facilitate higher volume manufacturing, the thermode tool 630 may include a flat surface that is substantially larger than any of the plurality of flexure bond pads, for example so that many bond pads may be subjected to the applied pressure and heat transfer simultaneously. The localized flexure tail thickness increases at the location of the bond pads, that result from folding the flexure tail 400 as shown and described previously with reference to FIG. 4C, may advantageously allow a large flat thermode tool (e.g. thermode tool 630) to provide pressure and heat only to the bond pad locations—without a need to first pattern or precisely align the thermode tool 630. This may advantageously simplify high volume manufacture. That is, in certain embodiments of the present invention, the local thickness variations of the flexure tail 400, that is caused by folding, may act as a self-aligning pattern to augment and assist the thermode tool to selectively apply pressure and heat more to desired bond pad locations of the flexure tail 400 than to undesired locations (e.g. locations away from the bond pads).

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A head gimbal assembly for a disk drive, the head gimbal assembly comprising:
   a read head; and
   a suspension assembly that comprises
      a load beam, and
      a laminate flexure that comprises a structural layer, a dielectric layer, and a conductive layer, the laminate flexure including a tongue portion that connects to the read head and a flexure tail that extends away from the tongue portion;
   wherein the flexure tail includes a plurality of flexure bond pads, and wherein each of the plurality of flexure bond pads is folded upon itself.

2. The head gimbal assembly of claim 1 wherein the laminate flexure defines a total folded thickness at each of the plurality of flexure bond pads that is at least twice a thickness of the structural layer, plus twice a thickness of the dielectric layer, plus twice a thickness of the conductive layer.

3. The head gimbal assembly of claim 1 wherein the thickness of the structural layer is less than 20 microns, the thickness of the dielectric layer is less than 15 microns, the thickness of the conductive layer is less than 15 microns, and the total folded thickness is at least 60 microns.

4. The head gimbal assembly of claim 1 wherein the structural layer comprises stainless steel, the dielectric layer comprises polyimide, and the conductive layer comprises copper.

5. A disk drive comprising:
   a disk drive base;
   a disk rotably mounted to the disk drive base;
   an actuator rotably mounted to the disk drive base, the actuator including a flexible printed circuit (FPC) that includes a plurality of electrically conductive FPC bond pads; and
   at least one head gimbal assembly attached to the actuator, the at least one head gimbal assembly comprising
      a read head; and
      a suspension assembly that comprises
         a load beam, and
         a laminate flexure that comprises a structural layer, a dielectric layer, and a conductive layer, the laminate flexure including a tongue portion that connects to the read head and a flexure tail that extends to the plurality of FPC bond pads;
      wherein the flexure tail includes a plurality of flexure bond pads, each of the plurality of flexure bond pads being aligned with a corresponding one of the plurality of FPC bond pads, and
      wherein each of the plurality of flexure bond pads is folded upon itself.

6. The disk drive of claim 5 wherein the laminate flexure defines a total folded thickness at each of the plurality of flexure bond pads that is at least twice a thickness of the structural layer, plus twice a thickness of the dielectric layer, plus twice a thickness of the conductive layer.

7. The disk drive of claim 5 wherein each of the flexure bond pads is bonded to the corresponding one of the plurality of FPC bond pads by an anisotropic conductive film.

8. The disk drive of claim 6 wherein the thickness of the structural layer is less than 20 microns, the thickness of the dielectric layer is less than 15 microns, the thickness of the conductive layer is less than 15 microns, and the total folded thickness is at least 60 microns.

9. The disk drive of claim 5 wherein the structural layer comprises stainless steel, the dielectric layer comprises polyimide, and the conductive layer comprises copper.

10. The disk drive of claim 7 wherein the anisotropic conductive film comprises an adhesive material that includes a plurality of electrically conductive beads of substantially similar size.

11. The disk drive of claim 10 wherein the plurality of electrically conductive beads is arranged in a monolayer with each of the plurality of electrically conductive beads in electrical contact with one of the plurality of flexure bond pads and the corresponding one of the plurality of FPC bond pads.

* * * * *